(12) United States Patent
Shi et al.

(10) Patent No.: US 8,451,152 B2
(45) Date of Patent: May 28, 2013

(54) PIPELINED ADC INTER-STAGE ERROR CALIBRATION

(75) Inventors: Kun Shi, Richardson, TX (US); Charles Sestok, Dallas, TX (US); Patrick Satarzadeh, Addison, TX (US); Arthur J. Redfern, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 150 days.

(21) Appl. No.: 13/032,457

(22) Filed: Feb. 22, 2011

(65) Prior Publication Data
US 2012/0212358 A1 Aug. 23, 2012

(51) Int. Cl.
*H03M 1/06* (2006.01)
(52) U.S. Cl.
USPC ............................................. 341/118; 341/161
(58) Field of Classification Search
USPC ........................... 341/118–120, 144, 155, 161
See application file for complete search history.

(56) References Cited

U.S. PATENT DOCUMENTS

| | | | |
|---|---|---|---|
| 6,081,215 A | 6/2000 | Kost et al. | |
| 6,445,317 B2 | 9/2002 | Lundin et al. | |
| 6,452,518 B1 | 9/2002 | Kawabata | |
| 7,095,346 B2 * | 8/2006 | Bogner | 341/120 |
| 7,280,064 B2 * | 10/2007 | Lin | 341/155 |
| 7,312,734 B2 | 12/2007 | McNeill et al. | |
| 7,595,744 B2 * | 9/2009 | Agarwal et al. | 341/118 |

OTHER PUBLICATIONS

"A 10b 100MSample/s CMOS Pipelined ADC with 1.8V Power Supply," Proc. ISSCC Digest Technical Papers, Feb. 2001, pp. 130-131 (Yong-In Park, S. Karthikeyan, Frank Tsay, Eduardo Bartolome).
"Split ADC Architecture for Deterministic Digital Background Calibration of a 16-bit 1-MS/s ADC," IEEE Journal of Solid State Circuits, vol. 40, pp. 2437-2445, Dec. 2005 (John McNeill, Michael C. W. Coln, and Brian J. Larivee).
Background calibration techniques for multistage pipelined ADCs with digital redundancy, IEEE Trans. Circuits Syst. II, Analog Digit. Signal Process., vol. 50, No. 9, pp. 531-538, Sep. 2003 (Jipeng Li, and Un-Ku Moon).

* cited by examiner

*Primary Examiner* — Brian Young
(74) *Attorney, Agent, or Firm* — Alan A. R. Cooper; Wade J. Brady, III; Frederick J. Telecky, Jr.

(57) ABSTRACT

An analog-to-digital converter (ADC) is provided. The ADC includes a plurality of pipelined ADCs and an adjustment circuit. Each pipelined ADC is adapted to receive an analog input signal, has an adjustable transfer function, and includes a compensator. The adjustment circuit is coupled to each pipelined ADC to be able to adjust the transfer function for each pipelined ADC so as to generally eliminate an estimation ambiguity. Additionally, the adjustment circuit estimates an inter-stage error that includes at least one of an inter-stage gain error and a DAC gain error and adjusts the compensator for each pipelined ADC to compensate for the inter-stage error.

19 Claims, 7 Drawing Sheets

PIPELINED ADC INTER-STAGE ERROR CALIBRATION

TECHNICAL FIELD

The invention relates generally to pipelined analog-to-digital converter (ADC) and, more particularly, to a pipelined ADC that employs a "split ADC" architecture to compensate for inter-stage gain error or digital-to-analog converter (DAC) gain error in each stage.

BACKGROUND

Pipelined ADCs have been used extensively (for example) in high performance digital communication systems, waveform acquisitions, and instrumentations. While the speed of state-of-the-art pipelined ADC has exceeded 100 MSPS, the resolution is generally limited by the inter-stage gain error and/or DAC gain error resulting from circuit nonidealities (i.e., capacitor mismatch and finite opamp gain, and so forth). Thus, most pipelined ADCs with more than 12-bit resolution usually require some linearity enhancement techniques.

Figure 1:
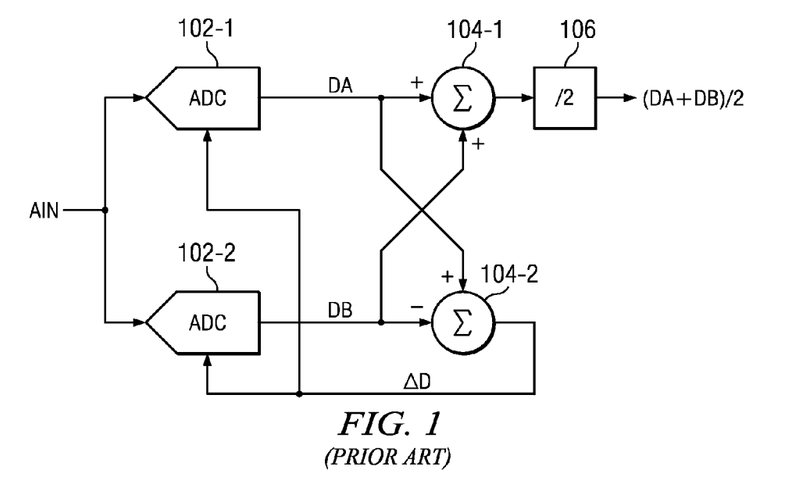
FIG. 1 is a diagram of an example of a conventional ADC.

There also exists an architecture, known as a "split ADC" architecture, that can be used to perform background calibrations, and, turning to FIG. 1, an example of a convention ADC 100 using a split ADC architecture can be seen. This ADC 100 generally comprises channels or ADCs 102-1 and 102-2, adders 104-1 and 104-2, and a divider 106. Typically, ADCs 102-1 and 102-2 have the same general structure, and, in operation, receive the same analog input signal AIN so as to perform a data conversion at approximately the same time (generating digital output signals DA and DB, respectively). The difference ΔD between these output signals DA and DB, which is generated by adder 104-2 (which operates as a subtractor), can be used for calibrating ADCs 102-1 and 102-2, while an average of the output signals DA and DB (generated by adder 104-1 and divider 106) would correspond to a digital output for ADC 100. However, there are difficulties in compensating for inter-stage gain errors and/or DAC gain errors when ADCs 102-1 and 102-2 are pipelined ADCs.

Therefore, there is a need for a method and/or apparatus that compensates for inter-stage gain error and/or DAC gain error in a pipelined ADC.

Some examples of conventional circuits are: Park et al., "A 10-b 100MS/s CMOS pipelined ADC with 1.8V power supply," *Proc. ISSCC Digest Technical Papers*, pp. 130-131, February 2001; McNeill et al., "Split ADC Architecture for Deterministic Digital Background Calibration of a 16-bit 1-MS/s ADC," *IEEE Journal of Solid State Circuits*, vol. 40, pp. 2437-2445, December 2005; Li et al., "Background calibration techniques for multistage pipelined ADCs with digital redundancy," *IEEE Trans. Circuits Syst. II, Analog Digit. Signal Process.*, vol. 50, no. 9, pp. 531-538, September 2003; U.S. Pat. Nos. 6,081,215; 6,445,317 6,452,518; 7,312,734; and U.S. Patent No. 2006/0176197.

SUMMARY

A preferred embodiment of the present invention, accordingly, provides an apparatus. The apparatus comprises a plurality of pipelined analog-to-digital converters (ADCs), wherein each pipelined ADC is adapted to receive an analog input signal, and wherein each pipelined ADC has a transfer function that is adjustable, and wherein each pipelined ADC includes a compensator; and an adjustment circuit that is coupled to each pipelined ADC, wherein the adjustment circuit adjusts the transfer function for each pipelined ADC so as to generally eliminate an estimation ambiguity, and wherein the adjustment circuit estimates an inter-stage error that includes at least one of an inter-stage gain error and a digital-to-analog converter (DAC) gain error and adjusts the compensator for each pipelined ADC to compensate for the inter-stage error.

In accordance with a preferred embodiment of the present invention, each pipelined ADC further comprises: a plurality of stages that are coupled to one another in a sequence; and a backend sub-ADC that is coupled to a last stage of the sequence.

In accordance with a preferred embodiment of the present invention, each compensator further comprises: a digital adder that is coupled to each stage of the sequence of its pipelined ADC; and a digital multiplier that is coupled between to the backend sub-ADC and the digital adder and that is coupled to the adjustment circuit, wherein the adjustment circuit adjusts the gain for the digital multiplier to compensate for the inter-stage error.

In accordance with a preferred embodiment of the present invention, each stage for each pipelined ADC further comprises: an input terminal; a sub-ADC that is coupled to the input terminal; a DAC that is coupled to the sub-ADC; an subtractor that is coupled to input terminal and the DAC; and a residue amplifier that is coupled to the subtractor.

In accordance with a preferred embodiment of the present invention, each sub-ADC further comprises a plurality of comparators that are adapted to be shifted so as to adjust the transfer function of its pipelined ADC.

In accordance with a preferred embodiment of the present invention, the adjustment circuit shifts the sub-ADC of the first stage of at least one of the pipelined ADCs by ¼ of a least significant bit (LSB).

In accordance with a preferred embodiment of the present invention, each stage for the pipelined ADC further comprises an analog multiplier that is coupled between the input terminal and the sub-ADC, wherein gain of the analog multiplier is adjusted by the adjustment circuit.

In accordance with a preferred embodiment of the present invention, a method for calibrating a ADC having a first pipelined ADC and a second pipelined ADC is provided. The method comprising shifting a first set of comparators of a first sub-ADC of a first stage of the first pipelined ADC by a first amount to adjust a first transfer function of the first pipelined ADC; shifting a second set of comparators of a first sub-ADC of a first stage of the second pipelined ADC by a second amount to adjust a second transfer function of the second pipelined ADC; estimating an inter-stage error for the ADC once first set of comparators and the second set of comparators have been shifted, wherein the inter-stage error includes at least one of an inter-stage gain error and a DAC gain error; and adjusting a first compensator of the first pipelined ADC and a second compensator of the second pipelined ADC to compensate for the inter-stage error.

In accordance with a preferred embodiment of the present invention, the step of adjusting further comprises: adjusting a first gain of a first digital multiplier of the first pipelined ADC; multiplying a digital output from a first back-end sub-ADC of the first pipelined ADC by the first gain; adding a digital output for each stage of the second pipelined ADC and for the first digital multiplier together; adjusting a second gain of a second digital multiplier of the second pipelined ADC; multiplying a digital output from a second back-end sub-ADC of the second pipelined ADC by the second gain; and adding a digital output for each stage of the second pipelined ADC and for the second digital multiplier together.

In accordance with a preferred embodiment of the present invention, the method further comprises: estimating a gain mismatch between the first and second pipelined ADCs; estimating an offset mismatch between the first and second pipelined ADCs; and compensating for the gain and offset mismatches.

In accordance with a preferred embodiment of the present invention, the first and second amounts are ¼ of an LSB.

In accordance with a preferred embodiment of the present invention, an apparatus is provided. The apparatus comprises a first pipelined ADC having a first transfer function and having: a first track-and-hold (T/H) circuit that is adapted to receive an analog input signal; a first set of stages that are coupled to one another in a first sequence, wherein a first stage of the first sequence is coupled to the first T/H circuit, and wherein at least one of the stages from the first set of stages is adjustable so as to adjust a first transfer function; a first backend sub-ADC that is coupled to a last stage of the first sequence; and a first compensator that is coupled to each stage from the first set of stages and the first backend sub-ADC; a second pipelined ADC having a second transfer function and having: a second T/H circuit that is adapted to receive the analog input signal; a second set of stages that are coupled to one another in a second sequence, wherein a first stage of the second sequence is coupled to the second T/H circuit, and wherein at least one of the stages from second set of stages is adjustable so as to adjust a second transfer function; a second backend sub-ADC that is coupled to a last stage of the second sequence; and a second compensator that is coupled to each stage from the second set of stages and the second backend sub-ADC; and an adjustment circuit that is coupled to the first and second pipelined ADCs so as to adjust the first and second transfer functions and that is coupled to the first and second compensators, wherein the adjustment circuit estimates interstage error that includes at least one of an inter-stage gain error and a DAC gain error and adjusts the first and second compensators to compensate for the inter-stage error.

In accordance with a preferred embodiment of the present invention, the first compensator further comprises a first digital adder that is coupled to each stage from the first set of stages; and a first digital multiplier that is coupled between to the first backend sub-ADC and the first digital adder and that is coupled to the adjustment circuit.

In accordance with a preferred embodiment of the present invention, the first compensator further comprises: a second digital adder that is coupled to each stage from the second set of stages; and a first digital multiplier that is coupled between to the second backend sub-ADC and the second digital adder and that is coupled to the adjustment circuit.

In accordance with a preferred embodiment of the present invention, each stage from the first and second sets of stages further comprises: an input terminal; a sub-ADC that is coupled to the input terminal; a DAC that is coupled to the sub-ADC; an subtractor that is coupled to input terminal and the DAC; and a residue amplifier that is coupled to the subtractor.

In accordance with a preferred embodiment of the present invention, each sub-ADC further comprises a flash ADC having a plurality of comparators, wherein each of the comparators are adapted to be shifted.

In accordance with a preferred embodiment of the present invention, the adjustment circuit shifts the sub-ADC of the first stage of at least one of the pipelined ADCs by ¼ of an LSB.

In accordance with a preferred embodiment of the present invention, the apparatus further comprises an output circuit that is coupled to the first and second digital adders.

In accordance with a preferred embodiment of the present invention, the first pipelined ADC further comprises a first mismatch compensator that is coupled between the first T/H circuit and the first stage of the first set of stages, and wherein second pipelined ADC further comprises a second mismatch compensator that is coupled between the second T/H circuit and the first stage of the second set of stages, and wherein the adjustment circuit estimate gain and offset mismatches between the first and second pipelined ADC and adjusts the first and second mismatch circuit.

In accordance with a preferred embodiment of the present invention, the adjustment circuit estimates the inter-stage error, the gain mismatch, and the offset mismatch using a least mean square (LMS) algorithm.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 2:
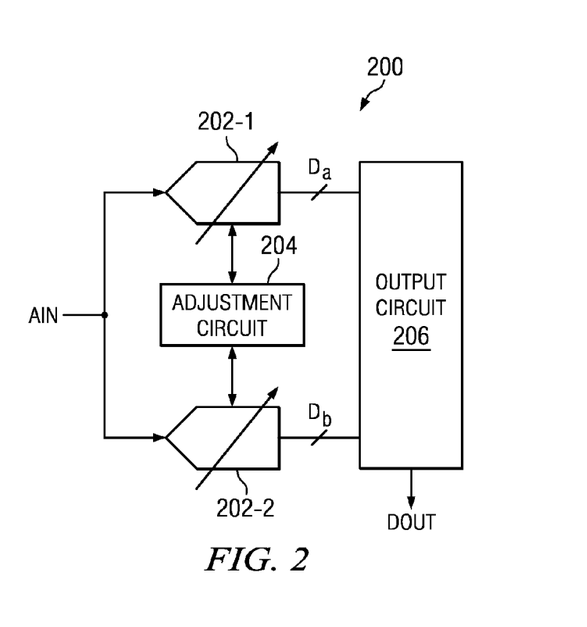
FIG. 2 is a diagram of an example of an ADC in accordance with a preferred embodiment of the present invention.

Turning to FIG. 2, an example of an ADC 200 in accordance with a preferred embodiment of the present invention can be seen. ADC 200 generally comprises pipelined ADCs 202-1 and 202-2, adjustment circuit 204, and output circuit 206. Here, two pipelined ADCs are shown for the sake of simplicity but additional pipelined ADCs or an ADC tree may be employed. In operation, each of ADCs 202-1 and 202-2 have generally the same structure and receive the analog input signal AIN so as to generate output signals $D_a$ and $D_b$ for the output circuit 206 (which can averages these signals and can perform digital correction). The adjustment circuit 204 provides adjustments to the ADCs 202-1 and 202-2 to compensate for inter-stage gain errors and/or DAC gain errors (within ADCs 202-1 and 202-2) and gain/offset mismatches (between ADCs 202-1 and 202-2).

Figure 3:
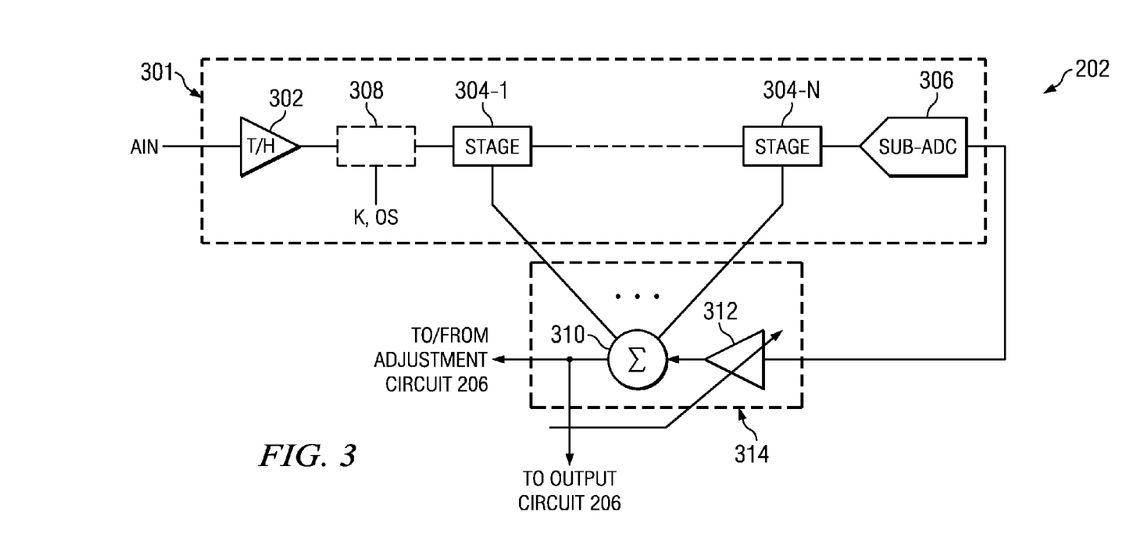
FIG. 3 is a diagram an example of a pipelined ADC of FIG. 2.

In FIG. 3, each pipeline ADC 202-1 and 202-2 (hereinafter 202 for FIG. 3) can be seen in greater detail. As shown, pipeline ADC 202 generally comprises a compensator 314 (which generally includes a digital multiplier or digital gain block 312 and an adder or combiner 310) and a pipeline 301 (which includes a track-and-hold (T/H) circuit 302, a mismatch compensator 308, a set of stages 304-1 to 304-N coupled together in a sequence, and a backend sub-ADC 306). In operation, the adjustment circuit 206 receives an output from the adder 310 (which combines the digital outputs from stages 304-1 to 304-N and backend sub-ADC 306) and should be able to compensate for inter-stage gain error and/or DAC gain error by perform adjustments (namely, adjusting the gain) to the digital multiplier 312 (which is coupled between the adder 310 and backend sub-ADC 306). However, under these circumstances, an estimation ambiguity exists that generally prevents an accurate estimation.

For simplicity, it can be assumed that there is one stage (i.e., 304-1) and a backend sub-ADC (i.e., 306). The output signals $D_a$ and $D_b$ would then be:

$$D_a = D_{1,a} + g_{2,a} \quad (1)$$

$$D_b = D_{1,b} + g_b D_{2,b} \quad (2)$$

where $D_{1,a}$ and $D_{1,b}$ are the output from the stages (i.e., 304-1), $D_2$, a and $D_2$, b are the output from the backend sub-ADCs (i.e., 306), and $g_a$ and $g_b$ are gains of the digital multipliers (i.e., 312). Because the output from the stages (i.e., 304-1) $D_{1,a}$ and $D_{1,b}$ should be the same, the difference $\Delta D$ would then be:

$$\Delta D = D_a - D_b = g_a D_{2,a} - g_b D_{2,b} \quad (3)$$

The optimal solution for the digital multipliers (i.e., 306) is:

$$g_a^{opt} = \frac{1}{G_{1a}} \quad (4)$$

$$g_b^{opt} = \frac{1}{G_{1b}} \quad (5)$$

where $G_{1,a}$ and $G_{1,b}$ denote the inter-stage gains and/or DAC gain errors, so, when the difference is minimized using a least mean square (LMS) algorithm, there is an estimation ambiguity because the number of variables exceeds the number of equations in the system. Namely, the estimation ambiguity is:

$$\hat{g}_a = \alpha g_a^{opt} \quad (6)$$

$$\hat{g}_b = \alpha g_b^{opt} \quad (7)$$

To address, this estimation ambiguity, adjustment circuit 204 can adjust the transfer function of each of the pipeline ADCs (i.e., 204-1 and 204-2 of FIG. 2), and there are several ways to adjust these transfer functions.

Figure 4:
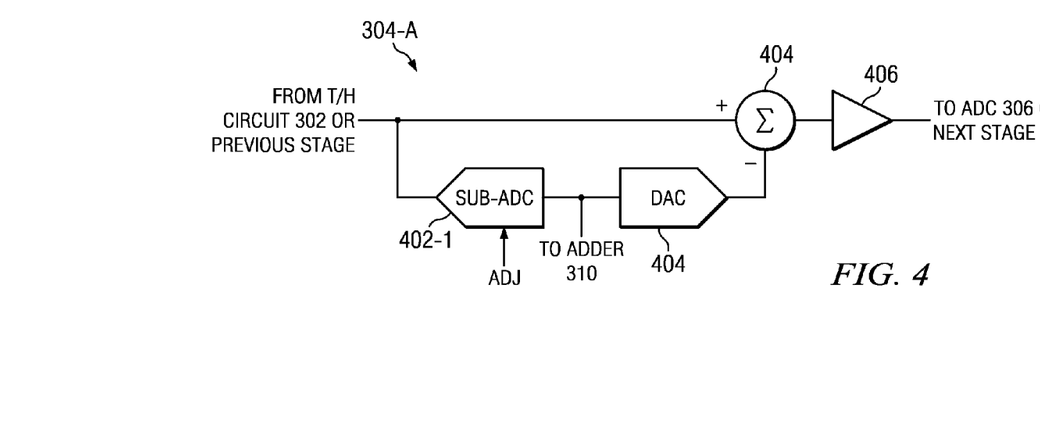
FIGS. 4 and 5 are diagrams of examples of a stage of FIG. 3.
Figure 5:
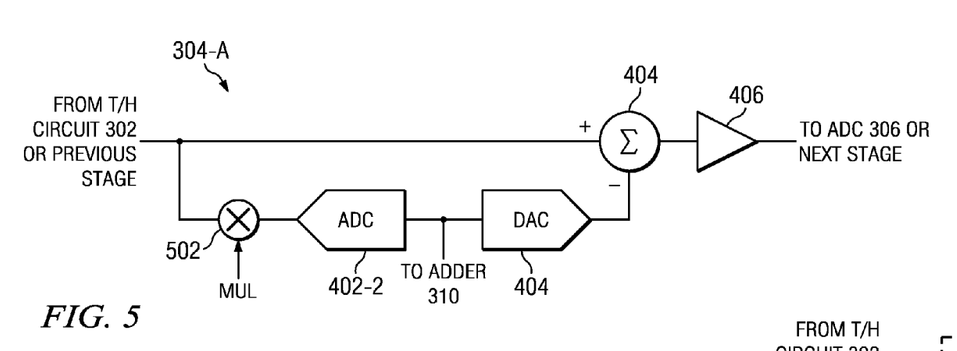

Looking to FIGS. 4 and 5, examples of one of the stages 304-1 to 304-N (hereinafter 304-A and 304-B for FIGS. 4 and 5, respectively), which can be adjusted by the adjustment circuit 204 can be seen. Stage 304-A generally comprises a sub-ADC 402-1, a DAC 404, an adder 408 (which operates as a subtractor), and a residue amplifier 406, while stage 304-B includes sub-ADC 402-1 and analog multiplier 502. Typically, the an analog signal (either from the T/H circuit 302 or a previous stage) is converted by sub-ADC 402-1 (or 402-1) to a digital signal. This digital signal is provided to adder 310 and DAC 404. The DAC 404 converts the signal back to an analog signal, and the analog signal from the DAC 404 (which can introduce a DAC gain) is subtracted from the analog signal from the T/H circuit 302 or a previous stage by adder 408 to generate a residue signal. This residue signal is amplified by residue amplifier 406 (which can introduce an inter-stage gain).

Figure 6:
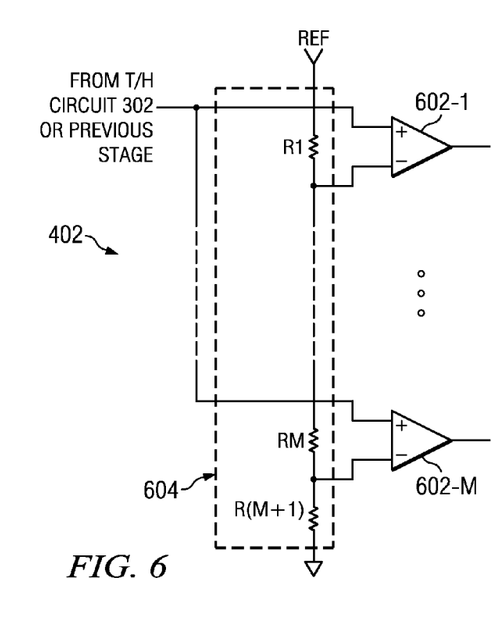
FIG. 6 is a diagram of an example of the sub-ADC of FIGS. 4 and 5.

As can be seen in FIG. 6, sub-ADC 402-1 or 402-2 (hereinafter 402) can be one of a variety of types of ADCs but is typically a flash ADC (as shown). This flash ADC 402 generally comprises a voltage divider 604 (which generally includes resistors R1 to R(M+1) coupled in series with one another) and comparators 602-1 to 602-M. Generally, each comparator 602-1 to 602-M is coupled to voltage divider 604 and receives an analog input signal to generate a digital output signal.

Figure 7A:
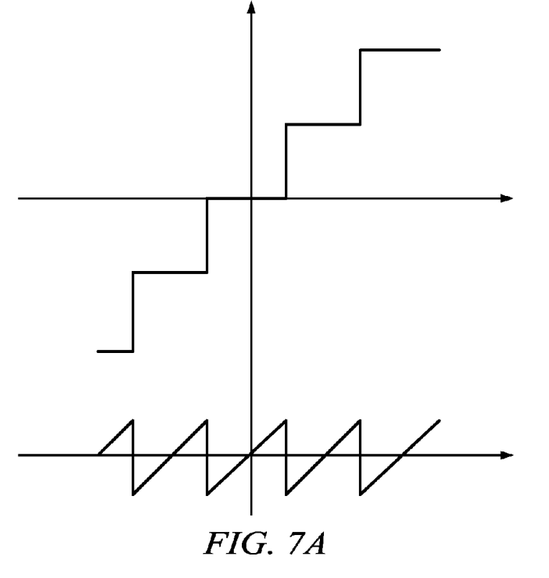
FIGS. 7A and 7B are diagrams depicting adjustments for the transfer functions of the pipelined ADCs of FIG. 2.
Figure 7B:
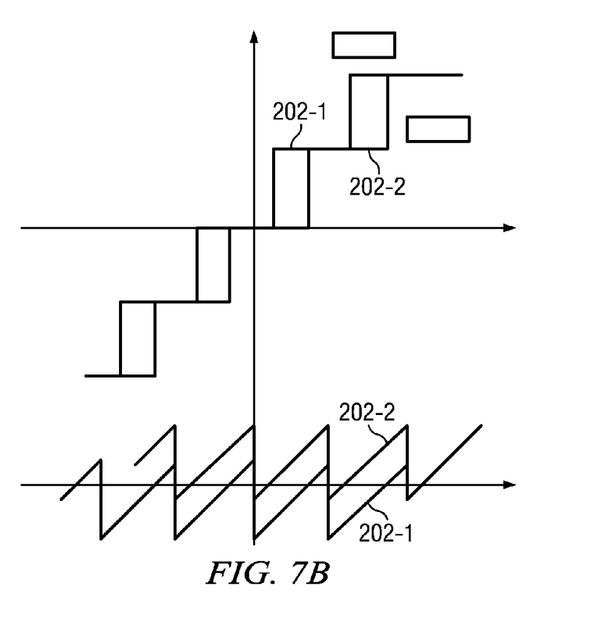

Turning back to FIG. 4, adjustments to the transfer function can be accomplished by making direct adjustments to the sub-ADC 402-1. Preferably, adjustments to the transfer function can be performed by shifting the comparators 602-1 to 602-M (i.e., shifting the reference voltage REF) within sub-ADC 402-1 with an adjustment signal ADJ. Usually, the transfer functions for each of pipeline ADCs 202-1 and 202-2 are supposed to match (as shown in FIG. 7A) match, but to resolve the estimation ambiguity described above, the comparators 602-1 to 602-M for one or more of the stages each of pipeline ADCs can be shifted by predetermined amounts. For example and as shown in FIG. 7B, the comparators 602-1 to 602-M for a the first stage (i.e., 304-1) for pipeline ADC 202-1 can be shifted by +¼ of a least significant bit (LSB), while the comparators 602-1 to 602-M for a the first stage (i.e., 304-1) for pipeline ADC 202-2 can be shifted by −¼ of an LSB. By doing this, however, some resolution in digital redundancy is lost.

Alternatively, as shown in FIG. 5, the analog signal from the T/H circuit 302 or from the previous stage can be modified before being converted. As shown, a multiplier 502 can be included in the signal path. The adjustment circuit 206 can provide a gain MUL (or alternatively a signal) to achieve substantially the same goal as directly adjusting ADC 402-1 described above.

It should also be noted that with multi-pipeline ADCs (i.e., ADC 200), there are gain and offset mismatches between the channels. These mismatches are not generally zeroed when the multipliers (i.e., 312) are adjusted to be substantially optimal. Thus, the estimation should take gain and offset mismatches into account. Assuming, again, (for the sake of simplicity of description) that there are two pipelined ADCs (as shown in FIG. 2) that each have two stages, where $K_a$ and $K_b$ denote the global gain for pipeline ADCs 202-1 and 202-2 (respectively), $OS_a$ and $OS_b$ denote the offset of for pipeline ADCs 202-1 and 202-2 (respectively), and $D_0$ is the ideal output. Ignoring inter-state gain and DAC gain error, the output signals $D_a$ and $D_b$ would be:

$$D_a = K_a D_0 + OS_a \quad (8)$$

$$D_b = K_b D_0 + OS_b \quad (9)$$

Now, a weighted difference $\delta D$ can be defined as follows using equations (8) and (9) above:

$$\delta D = K D_a - K_a D_b + OS = (KK - K_b) D_0 + (OS + OS_a - OS_b) \quad (10)$$

where K and OS are the gain and offset adjustments for mismatch compensator 308. The resulting cost function J would be:

$$J = \delta D^2 \quad (11)$$

When the gain adjustment K and the offset adjustment OS for mismatch compensator converge to:

$$K = \frac{K_b}{K_a}, \text{ and} \quad (12)$$

$$OS = OS_b - OS_a, \quad (13)$$

minimization of the cost function J would be zero, indicating gain and offset mismatches can be compensated for. Expanding this cost function to an adaptive estimation (which includes estimation for inter-stage gain error and/or DAC gain error), the output signals $D_a$ and $D_b$ would become:

$$D_a = K_a(D_{1,a} + g_a D_{2,a}) + OS_a \quad (14)$$

$$D_a = K_a(D_{1,a} + g_a D_{2,a}) + OS_a \quad (15)$$

An LMS algorithm can then be applied to the cost function J (of equation (11) above which uses the output signals $D_a$ and $D_b$ of equations (14) and (15)), leading to the following equations:

$$\hat{g}_a(k+1) = \hat{g}_a(k) = \mu_a \nabla J_{g_a} \quad (16)$$

$$\hat{g}_b(k+1) = \hat{g}_b(k) = \mu_b \nabla J_{g_b} \quad (17)$$

$$\hat{K}_a(k+1) = \hat{K}_a(k) = \mu_K \nabla J_K \quad (18)$$

$$\hat{OS}_a(k+1) = \hat{OS}_a(k) = \mu_{OS} \nabla J_{OS} \quad (19)$$

Thus, using equations (16)-(19) above, the adjustment circuit 204 can estimate (and compensate for) inter-stage gain error, DAC gain error and gain/offset mismatches at about the same time.

Figure 8A:
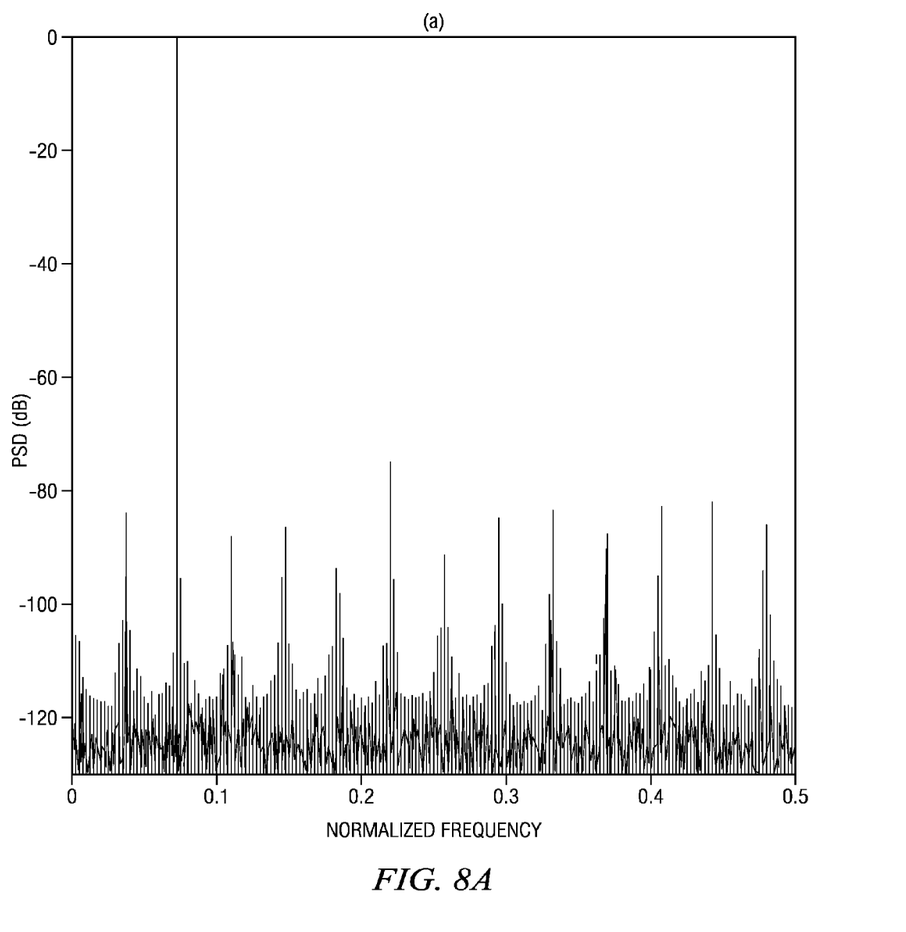
FIGS. 8A and 8B are diagrams depicting the spurious-free dynamic range (SFDR) of the ADC of FIG. 2 with and without calibration.
Figure 8B:
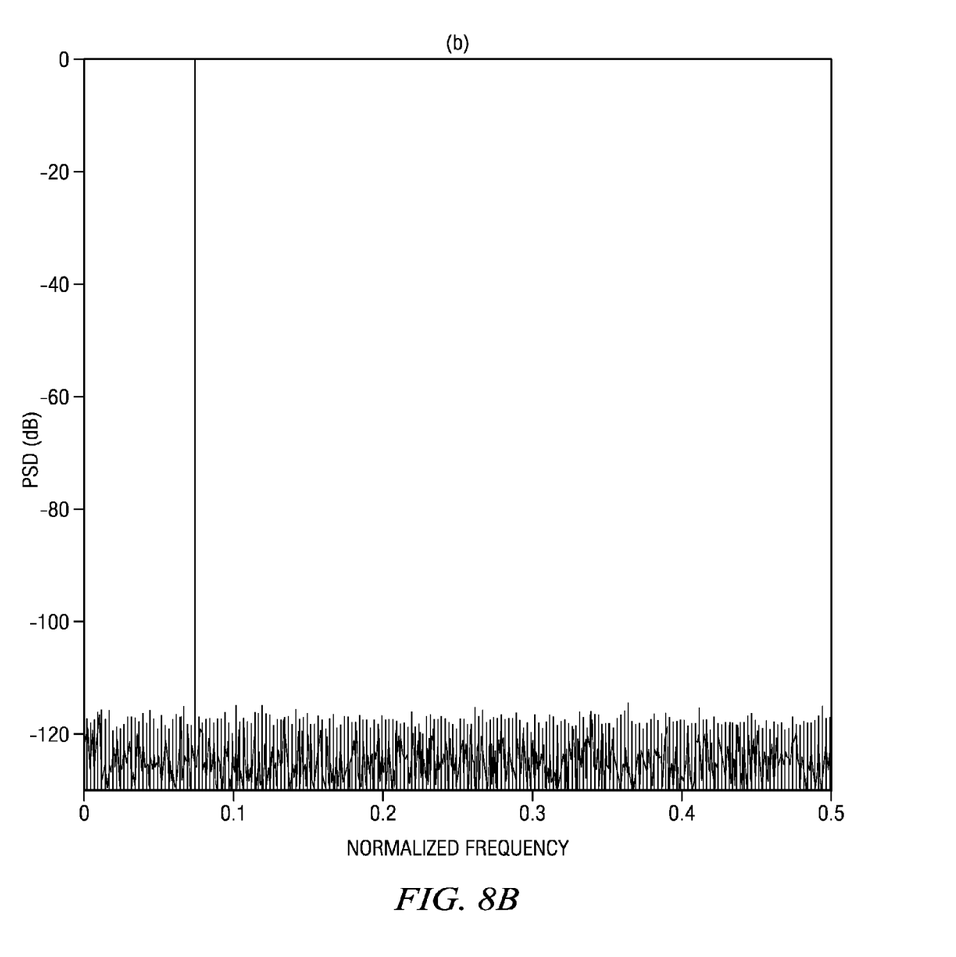
Figure 9:
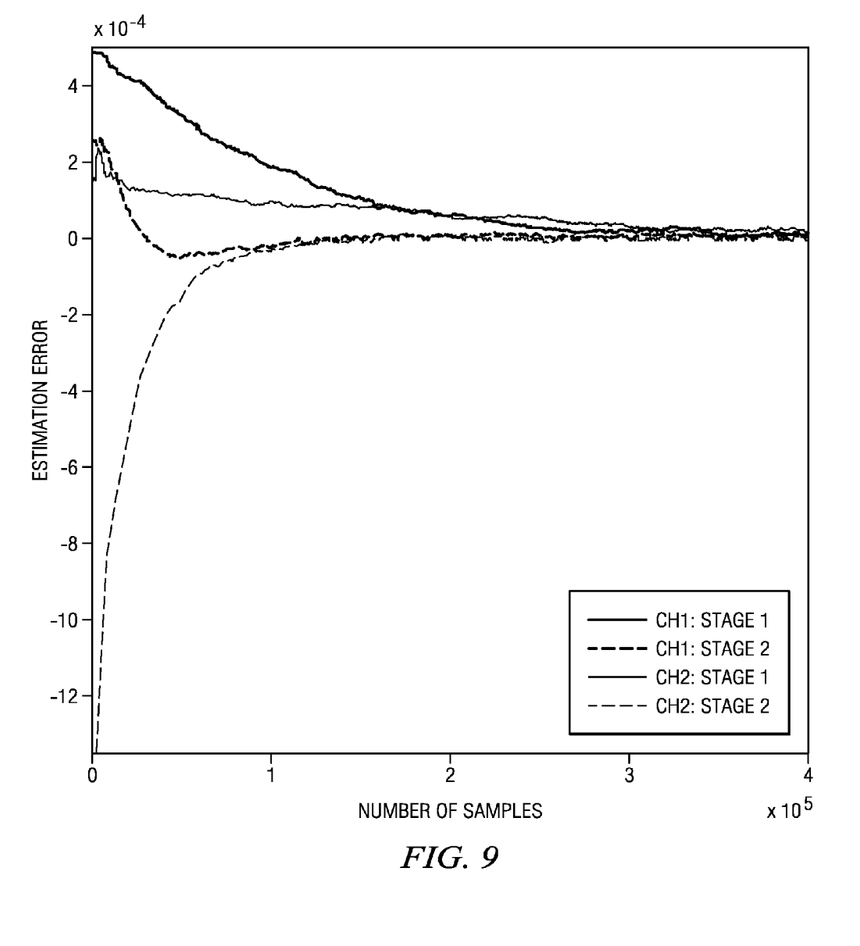
FIG. 9 is a diagram depicting the convergence of a calibration method used by the ADC of FIG. 2.

Turning to FIGS. 8A through 9, the results of some example simulations can be seen. For this example, each of pipelined ADCs 202-1 and 202-2 is a 16-bit pipelined ADC having four stages. Each of the four stages in the pipeline for this example has 4, 5, 5, and 5 bits for each stage, respectively. Correspondingly, the optimal inter-stage gains are 8 and 16 for the first and second stages. For this example, it is assumed that both pipelines have gain errors in the first two stages, and the gain implemented for pipelined ADCs 202-1 and 202-2 are shown in Table 1 below.

TABLE 1

|  | Pipelined ADC 202-1 | Pipelined ADC 202-2 |
| --- | --- | --- |
| Stage 1 | 8.0092 | 7.9077 |
| Stage 2 | 16.1278 | 16.0653 |

To model the channel mismatches, a 0.05% gain mismatch and 10 LSB offset mismatch were introduced. In FIGS. 8A and 8B, the SFDRs before and after the calibration are shown, and it can be observed that the SFDR is improved from 74 dB to 113 dB. Additionally, the convergence curve of the digital multipliers (i.e., 312) for each of pipelined ADCs 202-1 and 202-2 can be seen in FIG. 9, showing a convergence at about 40,000 samples when using a 1/10 LSB shift instead of 1/4 LSB shift (that would result in a longer convergence time), which is about 100 times faster than any other known approach and which is not restrictive (unlike some energy-free approaches).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a plurality of pipelined analog-to-digital converters (ADCs), wherein each pipelined ADC is adapted to receive an analog input signal, and wherein each pipelined ADC has a transfer function that is adjustable, and wherein each pipelined ADC includes a compensator; and
an adjustment circuit that is coupled to each pipelined ADC, wherein the adjustment circuit adjusts the transfer function for each pipelined ADC so as to generally eliminate an estimation ambiguity, and wherein the adjustment circuit estimates a inter-stage error that includes at least one inter-stage gain error and a digital-to-analog converter (DAC) gain error, and adjusts the compensator for each pipelined ADC to compensate for the inter-stage error; and a plurality of stages that are coupled to one another in a sequence; and a backend sub-ADC that is coupled to a last stage of the sequence.

2. The apparatus of claim 1, wherein each compensator further comprises:
a digital adder that is coupled to each stage of the sequence of its pipelined ADC; and
a digital multiplier that is coupled between to the backend sub-ADC and the digital adder and that is coupled to the adjustment circuit, wherein the adjustment circuit adjusts the gain for the digital multiplier to compensate for the inter-stage error.

3. The apparatus of claim 2, wherein each stage for each pipelined ADC further comprises:
an input terminal;
a sub-ADC that is coupled to the input terminal;
a DAC that is coupled to the sub-ADC;
an subtractor that is coupled to input terminal and the DAC; and
a residue amplifier that is coupled to the subtractor.

4. The apparatus of claim 3, wherein each sub-ADC further comprises a plurality of comparators that are adapted to be shifted so as to adjust the transfer function of its pipelined ADC.

5. The apparatus of claim 4, wherein the adjustment circuit shifts the sub-ADC of the first stage of at least one of the pipelined ADCs by 1/4 of a least significant bit (LSB).

6. The apparatus of claim 3, wherein each stage for the pipelined ADC further comprises an analog multiplier that is coupled between the input terminal and the sub-ADC, wherein gain of the analog multiplier is adjusted by the adjustment circuit.

7. A method for calibrating a ADC having a first pipelined ADC and a second pipelined ADC, the method comprising:
shifting a first set of comparators of a first sub-ADC of a first stage of the first pipelined ADC by a first amount to adjust a first transfer function of the first pipelined ADC;
shifting a second set of comparators of a first sub-ADC of a first stage of the second pipelined ADC by a second amount to adjust a second transfer function of the second pipelined ADC;
estimating an inter-stage error for the ADC once first set of comparators and the second set of comparators have been shifted, wherein the inter-stage error includes at least one of an inter-stage error and a DAC gain error; and adjusting a first compensator of the first pipelined ADC and a second compensator of the second pipelined ADC to compensate for the inter-stage error.

8. The method of claim 7, wherein the step of adjusting further comprises:
adjusting a first gain of a first digital multiplier of the first pipelined ADC;
multiplying a digital output from a first back-end sub-ADC of the first pipelined ADC by the first gain;
adding a digital output for each stage of the second pipelined ADC and for the first digital multiplier together;
adjusting a second gain of a second digital multiplier of the second pipelined ADC;
multiplying a digital output from a second back-end sub-ADC of the second pipelined ADC by the second gain; and
adding a digital output for each stage of the second pipelined ADC and for the second digital multiplier together.

9. The method of claim 8, wherein the method further comprises:
estimating a gain mismatch between the first and second pipelined ADCs;
estimating an offset mismatch between the first and second pipelined ADCs; and
compensating for the gain and offset mismatches.

10. The method of claim 9, wherein the first and second amounts are ¼ of an LSB.

11. An apparatus comprising:
a first pipelined ADC having a first transfer function and having:
a first track-and-hold (T/H) circuit that is adapted to receive an analog input signal;
a first set of stages that are coupled to one another in a first sequence, wherein a first stage of the first sequence is coupled to the first T/H circuit, and wherein at least one of the stages from the first set of stages is adjustable so as to adjust a first transfer function;
a first backend sub-ADC that is coupled to a last stage of the first sequence; and
a first compensator that is coupled to each stage from the first set of stages and the first backend sub-ADC;
a second pipelined ADC having a second transfer function and having:
a second T/H circuit that is adapted to receive the analog input signal;
a second set of stages that are coupled to one another in a second sequence, wherein a first stage of the second sequence is coupled to the second T/H circuit, and wherein at least one of the stages from second set of stages is adjustable so as to adjust a second transfer function;
a second backend sub-ADC that is coupled to a last stage of the second sequence; and
a second compensator that is coupled to each stage from the second set of stages and the second backend sub-ADC; and an adjustment circuit that is coupled to the first and second pipelined ADCs so as to adjust the first and second transfer functions and that is coupled to the first and second compensators, wherein the adjustment circuit estimates inter-stage error that includes at least one of an inter-stage gain error and a DAC gain error and adjusts the first and second compensators to compensate for the inter-stage error.

12. The apparatus of claim 11, wherein the first compensator further comprises:
a first digital adder that is coupled to each stage from the first set of stages; and
a first digital multiplier that is coupled between to the first backend sub-ADC and the first digital adder and that is coupled to the adjustment circuit.

13. The apparatus of claim 12, wherein the first compensator further comprises:
a second digital adder that is coupled to each stage from the second set of stages; and
a first digital multiplier that is coupled between to the second backend sub-ADC and the second digital adder and that is coupled to the adjustment circuit.

14. The apparatus of claim 13, wherein each stage from the first and second sets of stages further comprises:
an input terminal;
a sub-ADC that is coupled to the input terminal;
a DAC that is coupled to the sub-ADC;
an subtractor that is coupled to input terminal and the DAC; and
a residue amplifier that is coupled to the subtractor.

15. The apparatus of claim 14, wherein each sub-ADC further comprises a flash ADC having a plurality of comparators, wherein each of the comparators are adapted to be shifted.

16. The apparatus of claim 15, wherein the adjustment circuit shifts the sub-ADC of the first stage of at least one of the pipelined ADCs by ¼ of an LSB.

17. The apparatus of claim 16, wherein the apparatus further comprises an output circuit that is coupled to the first and second digital adders.

18. The apparatus of claim 17, wherein the first pipelined ADC further comprises a first mismatch compensator that is coupled between the first T/H circuit and the first stage of the first set of stages, and wherein second pipelined ADC further comprises a second mismatch compensator that is coupled between the second T/H circuit and the first stage of the second set of stages, and wherein the adjustment circuit estimate gain and offset mismatches between the first and second pipelined ADC and adjusts the first and second mismatch circuit.

19. The apparatus of claim 18, wherein the adjustment circuit estimates the inter-stage error, the gain mismatch, and the offset mismatch using a least mean square (LMS) algorithm.

* * * * *